US012610763B2

(12) United States Patent
Marion et al.

(10) Patent No.: US 12,610,763 B2
(45) Date of Patent: Apr. 21, 2026

(54) SEMICONDUCTOR DEVICES AND METHODS OF MANUFACTURING THE SAME

(71) Applicant: Tokyo Electron Limited, Tokyo (JP)

(72) Inventors: Jason Marion, Albany, NY (US);
Indroneil Roy, Albany, NY (US);
Yusuke Yoshida, Albany, NY (US);
Yun Han, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 259 days.

(21) Appl. No.: 18/343,124

(22) Filed: Jun. 28, 2023

(65) Prior Publication Data

US 2025/0006504 A1     Jan. 2, 2025

(51) Int. Cl.
*H01L 21/311*       (2006.01)
*H01L 21/308*       (2006.01)
*H01L 21/762*       (2006.01)

(52) U.S. Cl.
CPC .... *H01L 21/31116* (2013.01); *H01L 21/3086* (2013.01); *H01L 21/31144* (2013.01); *H01L 21/76224* (2013.01)

(58) Field of Classification Search
None
See application file for complete search history.

(56) References Cited

U.S. PATENT DOCUMENTS 9,653,320 B2     5/2017  Agarwal et al.
9,941,123 B1 *   4/2018  Abatchev ............ H01L 21/0332

2016/0293444 A1   10/2016  Park et al.
2019/0206723 A1 *  7/2019  Tokashiki ......... H01L 21/30655
2019/0244865 A1    8/2019  Xu et al.
2020/0273705 A1 *  8/2020  Singh .................. H01L 21/0332
2021/0028017 A1    1/2021  Lu et al.
2021/0242090 A1    8/2021  Wen et al.
2022/0234640 A1    7/2022  Fu et al.
2022/0359206 A1   11/2022  Chen et al.
2022/0359225 A1   11/2022  More et al.

FOREIGN PATENT DOCUMENTS

WO     WO-2022/234640 A1    11/2022

OTHER PUBLICATIONS

Foreign Search Report on non-Foley case related to US Dtd Aug. 1, 2024.

* cited by examiner

*Primary Examiner* — Roberts P Culbert
(74) *Attorney, Agent, or Firm* — Foley & Lardner LLP

(57)     ABSTRACT

A method includes providing a semiconductor substrate and forming a dielectric layer over the semiconductor substrate. The method includes forming a metal layer over the dielectric layer. The method includes forming a patterned mask over the metal layer. The method includes performing a first etching process using a first etchant to form metal patterns separated by trenches in the metal layer. The method further includes performing a second etching process using a second etchant and a passivant to extend the trenches in the dielectric layer, resulting in a passivation layer formed along sidewalls of the metal patterns.

17 Claims, 13 Drawing Sheets

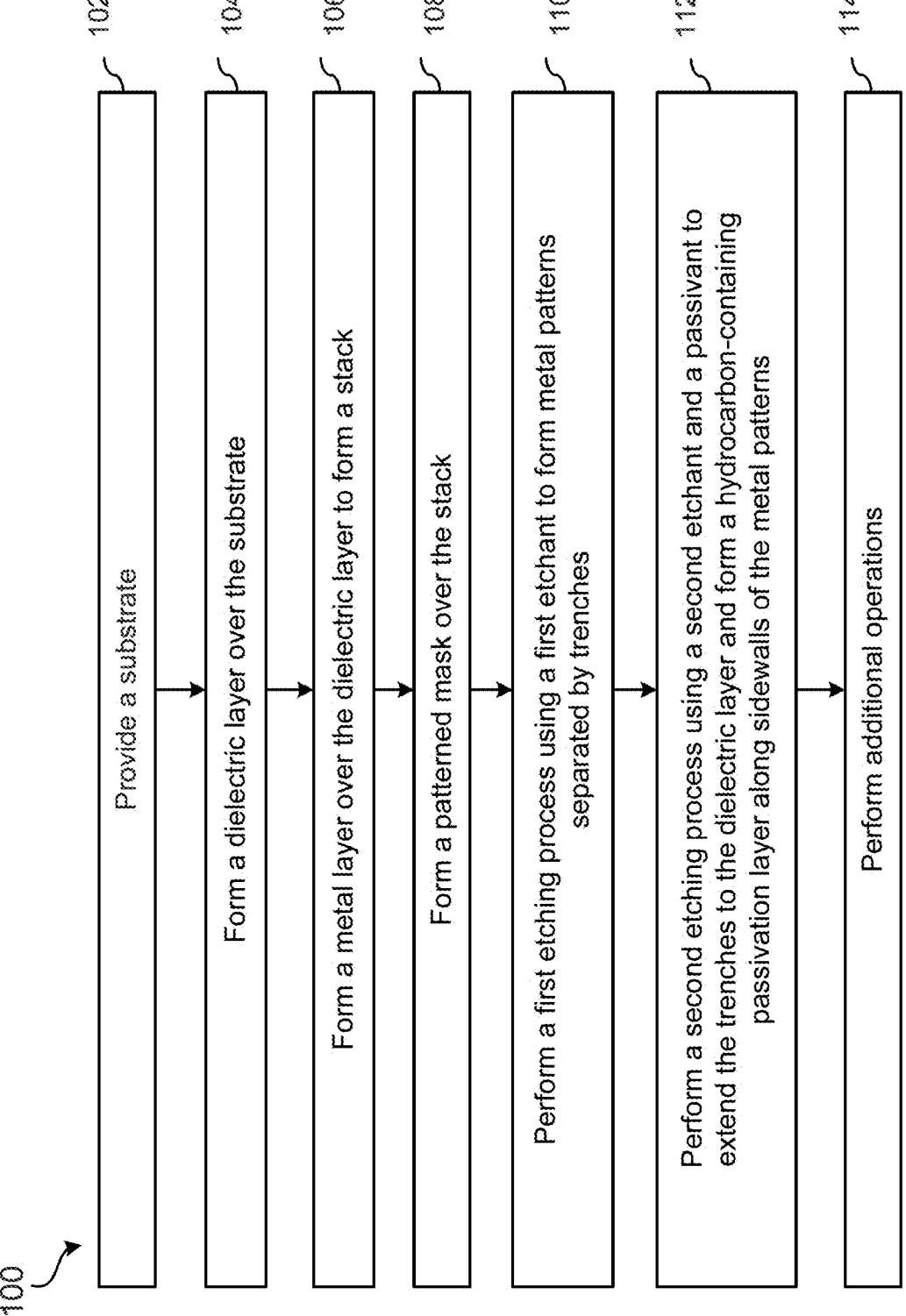

100

102 Provide a substrate

104 Form a dielectric layer over the substrate

106 Form a metal layer over the dielectric layer to form a stack

108 Form a patterned mask over the stack

110 Perform a first etching process using a first etchant to form metal patterns separated by trenches 112 Perform a second etching process using a second etchant and a passivant to extend the trenches to the dielectric layer and form a hydrocarbon-containing passivation layer along sidewalls of the metal patterns 114 Perform additional operations

FIG. 1

SEMICONDUCTOR DEVICES AND METHODS OF MANUFACTURING THE SAME

FILED OF THE DISCLOSURE

This disclosure relates to methods of manufacturing semiconductor devices and more particularly to methods of etching stacked metal layer and dielectric layer with improved etching selectivity and profile control.

BACKGROUND

In the manufacture of a semiconductor devices (especially on the microscopic scale), various fabrication processes are executed, including, for example, film-forming depositions, etch mask creation, patterning, material etching and removal, and doping treatments. These processes are performed repeatedly to form desired semiconductor device elements on a substrate. In recent development, it has become increasingly important to merge and/or compact fabrication steps to reduce processing complexity, cost, and/or time. However, as device features continue to decrease in critical dimension (CD), many challenges arise with respect to performing one or more of the processes described above to achieve specific design goals. For example, patterning and etching stacks of metal and dielectric layers (e.g., as a part of a metal gate cutting process) has become an important integration approach for the semiconductor industry. While existing methods of etching metal and dielectric layers have generally been adequate, they are not entirely satisfactory in all aspects.

SUMMARY

Described herein are methods of implementing etching processes for forming semiconductor devices.

In one aspect, the present disclosure may provide a method that includes providing a semiconductor substrate and forming a dielectric layer over the semiconductor substrate. The method includes forming a metal layer over the dielectric layer. The method includes forming a patterned mask over the metal layer. The method includes performing a first etching process using a first etchant to form metal patterns separated by trenches in the metal layer. The method further includes performing a second etching process using a second etchant and a passivant to extend the trenches in the dielectric layer, resulting in a passivation layer formed along sidewalls of the metal patterns.

In some implementations, forming the metal layer includes depositing a conductive material comprising tungsten, hafnium, aluminum, titanium, tantalum, lanthanum, yttrium, molybdenum, copper, or combinations thereof. In some implementations, the metal layer comprises a work function metal.

In some implementations, forming the dielectric layer includes depositing a dielectric material having one or more of silicon nitride, silicon oxide, a low-k dielectric material, or combinations thereof.

In some implementations, the first etchant and the second etchant each include a fluorine-containing gas, a chlorine-containing gas, or a combination thereof.

In some implementations, the passivant differs from the first etchant and the second etchant in composition, the passivant having one or more of $CH_4$, $CH_xF_y$, where x is greater than 0 and y is greater than or equal to 0, and a combination of a carbon-containing gas and a hydrogen-containing gas, such that the passivation layer is formed to include a hydrocarbon material.

In some implementations, performing one or both of the first etching process and the second etching process uses a carrier gas, a diluent gas, or both.

In some implementations, performing the second etching process simultaneously extends the trenches in the dielectric layer and grows a thickness of the passivation layer.

In another aspect, the present disclosure may provide a method that includes providing a semiconductor substrate and forming a dielectric layer over the semiconductor substrate. The method includes forming a conductive layer over the dielectric layer to form a stack. The method further includes forming a plurality of patterns in the stack. Forming the plurality of the patterns includes performing a first etching process to form top portions of the patterns in the conductive layer separated by first trenches, and performing a second etching process to form bottom portions of the patterns in the dielectric layer separated by second trenches that extend from the first trenches. The second etching process forms a hydrocarbon-containing passivation layer along sidewalls of the top portions of the patterns.

In some implementations, the method further includes forming the patterns further comprises forming a patterned mask over the stack before performing the first etching process.

In some implementations, performing the second etching process results in sidewalls of the bottom portions of the patterns to have a concave profile relative to the sidewalls of the top portions of the patterns.

In some implementations, a width of a widest portion of the second trenches is greater than a width of a bottom opening of the first trenches.

In some implementations, performing the second etching process includes applying a passivant having one or more of $CH_4$, $CH_xF_y$, x being greater than 0 and y being greater than or equal to 0, and a combination of a carbon-containing gas and a hydrogen-containing gas. In some implementations, performing the second etching process includes applying an etchant having a fluorine-containing gas selected from $CF_4$, $SF_6$, $NF_3$, and $CH_xF_y$, where x is greater than or equal to 0 and y is greater than 0. In some implementations, the conductive layer has a composition that is non-selective to the etchant applied during the second etching process.

In some implementations, the method further includes forming an active region over the semiconductor substrate, where forming the dielectric layer includes forming shallow-trench isolation features to surround the active region, where forming the conductive layer comprises forming a metal gate structure over a portion of the active region, and where the first trenches and the second trenches separate the metal gate structure into segments.

In some implementations where the dielectric layer is a first dielectric layer, the method further includes forming a second dielectric layer to fill the first trenches and the second trenches.

In yet another aspect, the present disclosure may provide a semiconductor structure that includes an active region over a substrate and oriented lengthwise along a first direction. The semiconductor structure includes an isolation structure disposed over bottom portions of the active region. The semiconductor structure includes a metal gate segment disposed over the active region and the isolation structure, where the metal gate segment is oriented lengthwise along a second direction perpendicular to the first direction. The semiconductor structure further includes a gate isolation feature adjacent the metal gate segment and the isolation structure, the gate isolation feature being oriented length-wise along the first direction, wherein a sidewall of the gate isolation feature includes a top portion over a bottom portion, and wherein the bottom portion has a concave profile with respect to the top portion.

In some implementations, the isolation structure includes shallow-trench isolation feature. In some implementations, the metal gate segment includes a work function metal.

These and other aspects and implementations are discussed in detail below. The foregoing information and the following detailed description include illustrative examples of various aspects and implementations, and provide an overview or framework for understanding the nature and character of the claimed aspects and implementations. The drawings provide illustrations and a further understanding of the various aspects and implementations, and are incorporated in and constitute a part of this specification. Aspects can be combined, and it will be readily appreciated that features described in the context of one aspect of the invention can be combined with other aspects. Aspects can be implemented in any convenient form. As used in the specification and in the claims, the singular form of "a," "an," and "the" include plural referents unless the context clearly dictates otherwise.

BRIEF DESCRIPTION OF THE DRAWINGS

Non-limiting embodiments of the present disclosure are described by way of example with reference to the accompanying figures, which are schematic and are not intended to be drawn to scale. Unless indicated as representing the background art, the figures represent aspects of the disclosure. For purposes of clarity, not every component may be labeled in every drawing. In the drawings:

FIG. 1 illustrates a flowchart of an example method of fabricating a semiconductor structure, in accordance with some implementations.

DETAILED DESCRIPTION

Figure 2:
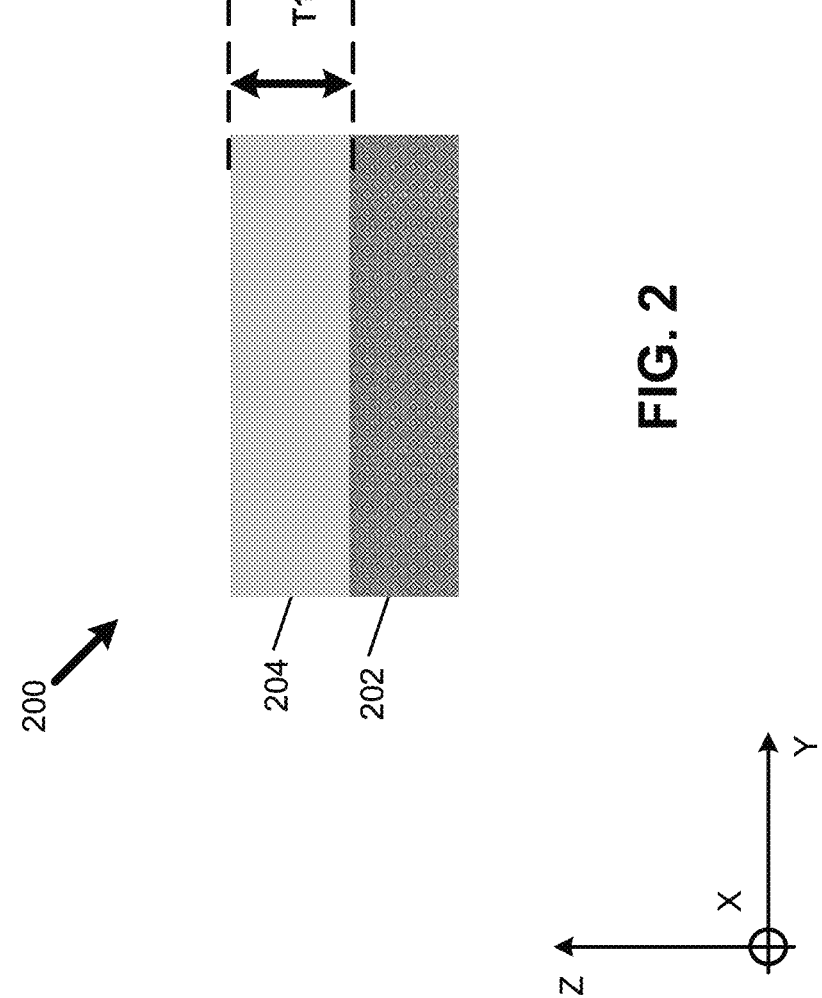
FIGS. 2, 3, 4, 5, 6, 7, 8, 9, 10, and 11 each illustrate a cross-sectional view of an example semiconductor structure at intermediate steps of the method illustrated in FIG. 1, in accordance with some implementations.

Reference will now be made to the illustrative embodiments depicted in the drawings, and specific language will be used here to describe the same. It will nevertheless be understood that no limitation of the scope of the claims or this disclosure is thereby intended. Alterations and further modifications of the inventive features illustrated herein, and additional applications of the principles of the subject matter illustrated herein, which would occur to one skilled in the relevant art and having possession of this disclosure, are to be considered within the scope of the subject matter disclosed herein. Other embodiments may be used or other changes may be made without departing from the spirit or scope of the present disclosure. The illustrative embodiments described in the detailed description are not meant to be limiting of the subject matter presented.

FIG. 1 illustrates a flowchart of an example method 100 for fabricating a semiconductor structure, according to some implementations of the present disclosure. The method 100 is described in reference to FIGS. 2-11, which illustrate cross-sectional views of a semiconductor structure 200 during intermediate steps of the method 100, according to some implementations of the present disclosure. It is noted that the method 100 is merely an example and is not intended to limit the present disclosure. It is further understood that additional operations may be provided before, during, and after each of the method 100 and that some other operations may only be briefly described herein.

Referring to FIGS. 1 and 2, the method 100 at operation 102 provides the semiconductor structure 200 that includes a substrate 202.

The substrate 202 may include a semiconductor material, such as a bulk semiconductor, a semiconductor-on-insulator (SOI), or the like, which may be doped (e.g., with a p-type or an n-type dopant) or undoped. The substrate 202 may be or correspond to a wafer, such as a silicon wafer. Generally, an SOI includes a layer of a semiconductor material formed on an insulator layer. The insulator layer may be, for example, a buried oxide (BOX) layer, a silicon oxide layer, or the like. The substrate 202 may include other semiconductor materials, such as a multi-layered or gradient semiconductor material. In some examples, the substrate 202 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; other suitable materials; or combinations thereof.

In some implementations, the substrate 202 includes active regions (not depicted) configured to provide a number of device features (e.g., transistors, diodes, resistors, etc.; not depicted) in and/or over the substrate 202. Example transistors may include field-effect transistors (FETs), such as fin-like FET (e.g., FinFET), multi-gate FETs, nanosheet FETs, the like, or combinations thereof. The device features may include doped or undoped semiconductor materials, which may be similar in composition as the substrate 202. In this regard, providing the substrate 202 at operation 102 may further include defining the active regions in and/or over the substrate 202. The active regions may be planar and defined by performing one or more doping process to portions of the substrate 202 to form doped wells (e.g., n-type doped wells or p-type doped wells). Alternatively, the active regions may be three-dimensional (3D) that protrude from the substrate 202 along the Z axis. In this regard, the active regions may include fin-like active regions (e.g., active regions 403 depicted in FIG. 12) configured to form FinFETs or a plurality of semiconductor layers (e.g., nanosheets) stacked over the substrate 202 and configured to form nanosheet FETs, for example. The stack of semiconductor layers may be formed by performing a series of epitaxial growth processes followed by a patterning process, for example.

Still referring to FIGS. 1 and 2, the method 100 at operation 104 forms a dielectric layer 204 on or overalying the substrate 202.

In the present implementations, the dielectric layer 204 includes a nitride-containing material, such as silicon nitride (SiN), an oxide-containing material, such as silicon oxide ($SiO_2$), a low-k dielectric material (e.g., a dielectric material having a dielectric constant less than that of silicon oxide, which is about 3.9), the like, or combinations thereof. The dielectric layer 204 may be formed or deposited using at least one suitable technique, such as chemical vapor deposition (CVD), flowable CVD (FCVD), atomic layer deposition (ALD), physical vapor deposition (PVD), spin coating, the like, or combinations thereof. The dielectric layer 204 may be formed to a thickness T1 that is configured to reduce or prevent charge transfer from a subsequently formed metal layer (e.g., the metal layer 206) to the substrate 202. In this regard, the thickness T1 may include a range from about 25 nm to at least about 150 nm. In some implementations, the dielectric layer 204 includes isolation features, such as shallow-trench isolation (STI) features, configured to isolate the active regions formed in and/or over the substrate 202.

Figure 3:
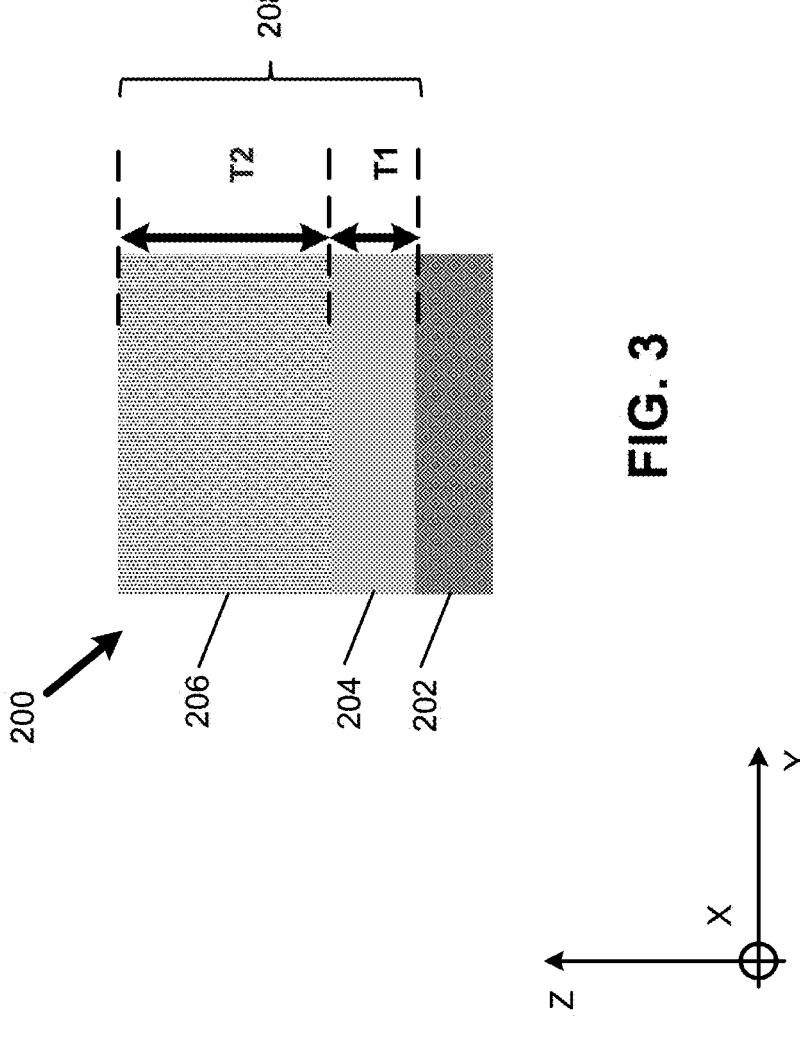

Referring to FIGS. 1 and 3, the method 100 at operation 106 forms a metal layer (or a conductive layer) 206 over the dielectric layer 204, where the dielectric layer 204 and the metal layer 206 together form a stack 208.

In the present implementations, the metal layer 206 includes any suitable metal, such as tungsten (W), hafnium (Hf), aluminum (Al), titanium (Ti), tantalum (Ta), lanthanum (L), yttrium (Y), molybdenum (Mo), copper (Cu), the like, or combinations thereof. In some implementations, the metal layer 206 includes different metals. In some implementations, the metal layer 206 includes one or more work function metals, such as an n-type work function metal or a p-type work function metal, including one or more of the metals provided herein. In some implementations, the metal layer 206 has a multi-layered structure that includes more than one sub-layers of different conductive materials.

In some implementations, the metal layer 206 is configured as a metal gate structure, or a portion thereof, that overlays a portion (e.g., a channel region) of an active region over the substrate 202. In this regard, the metal layer 206 may be formed by a gate process including, for example, first forming a dummy gate structure (e.g., a polysilicon structure or a dielectric structure) over the active region and the dielectric layer 204 as a placeholder and, after forming source/drain features (not depicted) in the active region, replacing the dummy gate structure with the metal layer 206 as the metal gate structure. Other methods of forming a metal gate structure may also be implemented in the formation of the metal layer 206.

The metal layer 206 may be formed by using any suitable technique, such as CVD, ALD, PVD, electroplating, electroless plating, the like, or combinations thereof. In some implementations, the metal layer 206 is formed to a thickness T2 that is greater than the thickness T1. The thickness T2 may be in a range of about 100 nm to about 200 nm, such as about 120 nm. In some implementations, a seed layer (not depicted) may be formed over the dielectric layer 204 before depositing the conductive material to form the metal layer 206. For example, if the metal layer 206 includes Cu, a Cu-containing seed layer may be first deposited over the dielectric layer 204 before depositing the metal layer 206 using any suitable technique described herein. In some implementations, the dielectric layer 204 and the metal layer 206 are blanket-deposited over the substrate 202 (i.e., any features formed in and/or over the substrate 202, such as fin active regions and the STI features) and subsequently patterned.

Figure 4:
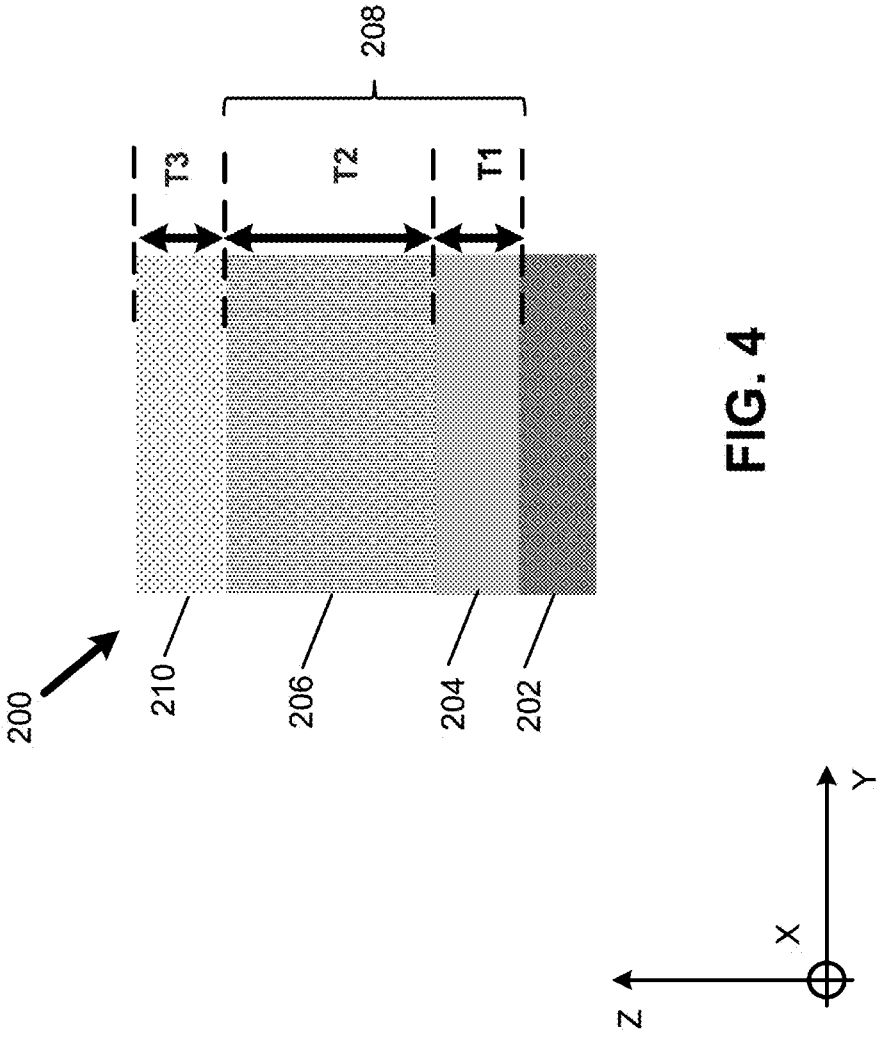
Figure 5:
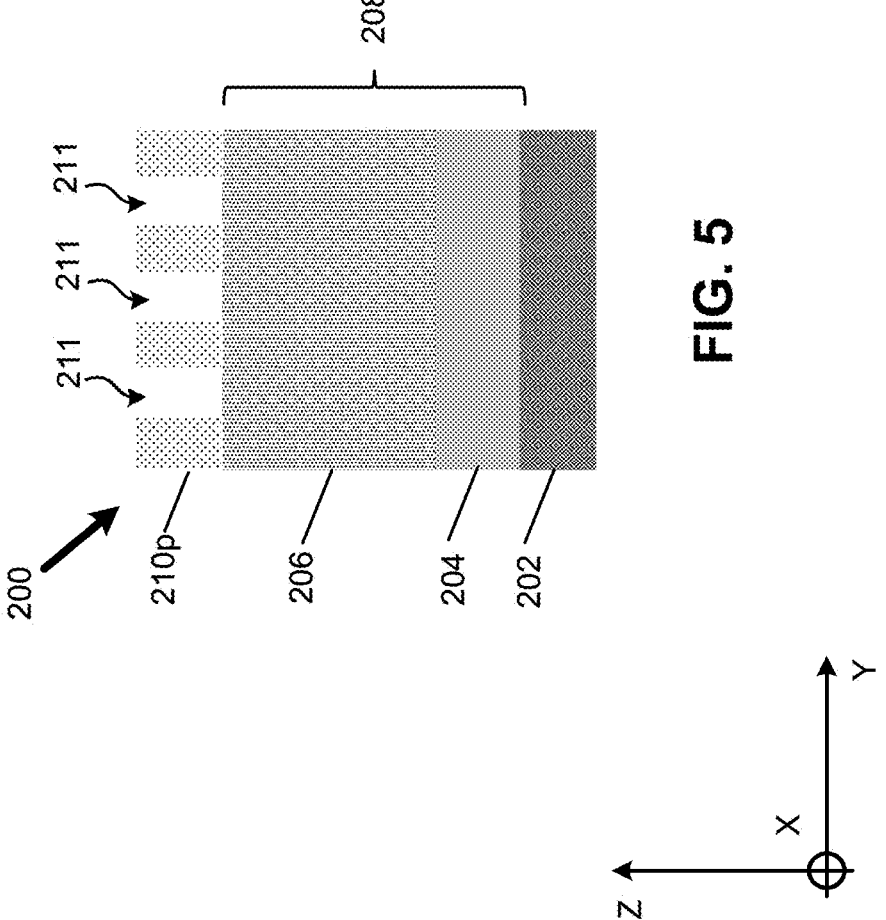

Referring to FIGS. 1, 4, and 5, the method 100 at operation 108 forms a patterned mask 210p over the stack 208. Referring to FIGS. 1 and 4, the method 100 first forms a hard mask 210 over the metal layer 206. The hard mask 210 may include any suitable dielectric material that exhibits etching selectivity with respect to the underlying metal layer 206 and dielectric layer 204. For example, the hard mask 210 may include SiN, $SiO_2$, SiCN, silicon carbide (SIC), silicon oxynitride (SiON), the like, or combinations thereof. In this regard, the hard mask 210 has a composition that is different from that of the metal layer 206. In some implementations, the hard mask 210 has a composition that is the same as that of the dielectric layer 204. The hard mask 210 may be formed as a blank layer using any suitable deposition technique, such as CVD, ALD, PVD, spin coating, the like, or combinations thereof. The hard mask 210 may be formed to a thickness T3 in a range of about 25 nm to about 200 nm, such as about 80 nm. For implementations in which the hard mask 210 and the dielectric layer 204 have the same composition, the thickness T3 may be determined based on the etching selectivity between the composition of the hard mask 210 (or the dielectric layer 204) and that of the metal layer 206.

Referring to FIGS. 1 and 5, the method 100 then patterns the hard mask 210 to form the patterned mask 210p. The patterned mask 210p may be formed using a series of lithography and etching processes, which include forming a photoresist layer (not depicted) over the hard mask 210, exposing the photoresist layer to a suitable light source, developing the photoresist layer to form a patterned photoresist layer, etching the hard mask using the patterned photoresist layers as an etch mask to form the patterned hard mask 210, and subsequently removing the patterned photoresist layers by a suitable method, such as resist stripping or plasma ashing. In the present implementations, the patterned mask 210p is formed to include a plurality of trenches 211 that expose portions of the metal layer 206 to be removed by the subsequent etching process.

Figure 6:
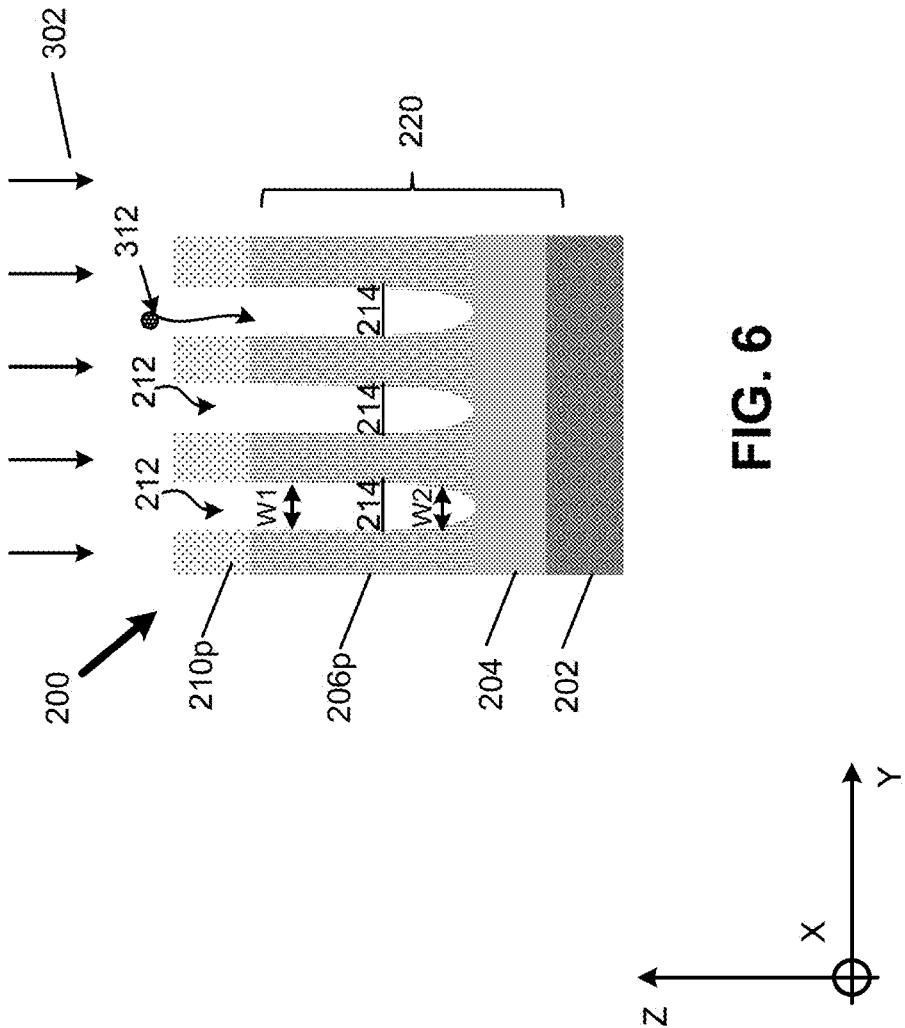

Referring to FIGS. 1 and 6, the method 100 at operation 110 performs a first etching process 302 using a first etchant 312 to form top portions 206p of patterns 220, where the top portions 206p are separated by first trenches 214 in the metal layer 206. In the depicted implementations, the first trenches 214 are top portions of trenches 212.

The first etching process 302 may be any suitable etching process, such as a dry etching process implemented using a chemically reactive plasma. In this regard, the first etching process 302 is considered a reactive ion etching (RIE) process. In some implementations, the first etching process 302 is performed using the first etchant 312 configured to react with at least the metal layer 206. In some implementations, the first etchant 312 is configured to react with both the metal layer 206 and the dielectric layer 204. In the present implementations, the first etchant 312 does not react, or substantially react, with the patterned mask 210p. In this regard, the metal layer 206 is considered non-selective to the first etchant 312 and the patterned mask 210p is considered selective to the first etchant 312.

In some implementations, the first etchant 312 includes a fluorine-containing gas (or etchant), such as a fluorocarbon-containing gas, a hydrofluorocarbon-containing gas, the like, or combinations thereof. For example, the first etchant 312 may include a fluorine-containing gas having a chemical formula $CH_xF_y$, where $x \geq 0$, $y \geq 0$, and values of x and y satisfy stoichiometric ratios suitable for a given chemical formula. In this regard, if x=0, then the fluorine-containing gas includes a fluorocarbon-containing gas, and if x>0, then the fluorine-containing gas includes a hydrofluorocarbon-containing gas. Non-limiting examples of the fluorine-containing gas with such chemical formula may include $CF_4$, $CHF_3$, $CH_3F$, $CH_2F_2$, or the like. In some implementations, the first etchant 312 includes a fluorine-containing gas having one or more non-carbon atoms. For example, the fluorine-containing gas may include $SF_6$, $SiF_4$, $NF_3$, the like, or combinations thereof. Additionally or alternatively, the first etchant 312 includes a chlorine-containing gas (or etchant), such as $SiCl_4$, $Cl_2$, $BCl_3$, the like, or combinations thereof. Other etchants may also be applicable according to implementations of the present disclosure. In some implementations, the first etchant 312 may additionally include a carrier gas, a diluent gas, or a combination thereof. For example, the first etchant 312 may include argon (Ar).

In some implementations, an etching duration of the first etching process 302 is controlled such that the first trenches 214 stop on or slightly below a top surface of the dielectric layer 204. In other words, the first etching process 302 is configured to remove portions of the metal layer 206 without removing, or substantially removing, portions of the dielectric layer 204. In the depicted implementations, the first trenches 214 narrow in width along the X axis as they deepen in depth along the Z axis, i.e., a width W1 near a top opening of each first trench 214 is greater than a width W2 near a bottom opening of each first trench 214.

Referring to FIGS. 1 and 7-10 collectively, the method 100 at operation 112 performs a second etching process 304 using a combination of a second etchant 314 and a passivant 316 to form bottom portions 204p of the patterns 220 separated by second trenches 216 in the dielectric layer 204. The second trenches 216 form bottom portions of the trenches 212.

Similar to the first etching process 302, the second etching process 304 may be an RIE process implemented using a chemically reactive plasma. In the present implemenations, as indicated by the arrows depicted in FIG. 7, the second etching process 304 is performed using a plasma that includes the second etchant 314 configured to react with both the metal layer 206 and the dielectric layer 204. In other words, the second etchant 314 is capable of removing portions of both the metal layer 206 and the dielectric layer 204. In the present implementations, the second etchant 314 does not react, or substantially react, with the patterned mask 210p. In this regard, the metal layer 206 and the dielectric layer 204 are considered non-selective to the second etchant 314, and the patterned mask 210p is considered selective to the second etchant 314.

In the present implementations, the second etchant 314 includes a fluorine-containing gas (or etchant), such as a fluorocarbon-containing gas, a hydrofluorocarbon-containing gas, or both. In some implementations, the second etchant 314 may be similar to, or the same as, the first etchant 312. For example, the second etchant 314 may include a fluorine-containing gas having a chemical formula $CH_xF_y$, where x≥0 and y≥0 as described above. Additionally or alternatively, the second etchant 314 may include a fluorine-containing gas having one or more non-carbon atoms. In this regard, non-limiting examples of the second etchant 314 may include $CF_4$, $CHF_3$, $CH_3F$, $CH_2F_2$, $SF_6$, $SiF_4$, $NF_3$, the like, or combinations thereof. Other etchants may also be applicable according to implementations of the present disclosure. In some implementations, the second etchant 314 may additionally include a carrier gas, a diluent gas, or a combination thereof. For example, the second etchant 314 may additionally include Ar.

Furthermore, the plasma implemented at the second etching process 304 includes the passivant 316, which is a gas configured to selectively react with the metal layer 206 relative to the dielectric layer 204 and form a passivation layer 224 on sidewalls of the top portions 206p. In other words, the passivant 316 reacts with the metal layer 206 but does not react, or substantially react, with the dielectric layer 204.

The passivant 316 may include any suitable chemicals capable of reacting with the metal layer 206 to form a hydrocarbon-containing material (e.g., a hydrocarbon-containing polymer) in the passivation layer 224. For example, the passivant 316 may include a hydrocarbon-containing gas having a chemical formula $C_mH_n$, where m>0, n>0, and values of m and n satisfy stoichiometric ratios suitable for a given chemical formula. In some examples, the passivant 316 may include $CH_4$, $C_2H_6$, $C_3H_8$, the like, or combinations thereof. In some implementations, the passivant 316 includes a hydrofluorocarbon-containing gas. For example, the passivant 316 may include a gas having a chemical formula $CH_xF_y$, where x>0, y≥0, and values of x and y satisfy stoichiometric ratios suitable for a given chemical formula. In some implementations, the passivant 316 includes any combination of a carbon-containing gas and a hydrogen-containing gas. For example, the passivant 316 may include a combination of carbon dioxide ($CO_2$) and hydrogen ($H_2$). In some implementations, the passivant 316 has a composition that is the same as that of the second etchant 314. For example, the $C_mH_n$ of the passivant 316 and the $CH_xF_y$ of the second etchant 314 can both form hydrocarbon materials (e.g., the passivation layer 224) on the metal layer 206 at a higher rate than on the dielectric layer 204, thereby providing protection for the metal layer 206 during the second etching process 304.

In some implementations, the passivant 316 has a composition that is different from that of the first etchant 312 and the second etchant 314. In one such example, the first etchant 312 may include $CH_2F_2$, the second etchant 314 may include $CF_4$, and the passivant 316 may include $CH_4$. In some implementations, the first etchant 312 and the second etchant 314 have different compositions. In some implementations, the first etchant 312 and the second etchant 314 have the same composition. For example, the first etchant 312 and the second etchant 314 may both include $CF_4$, and the passivant 316 may include $CH_4$.

Figure 7:
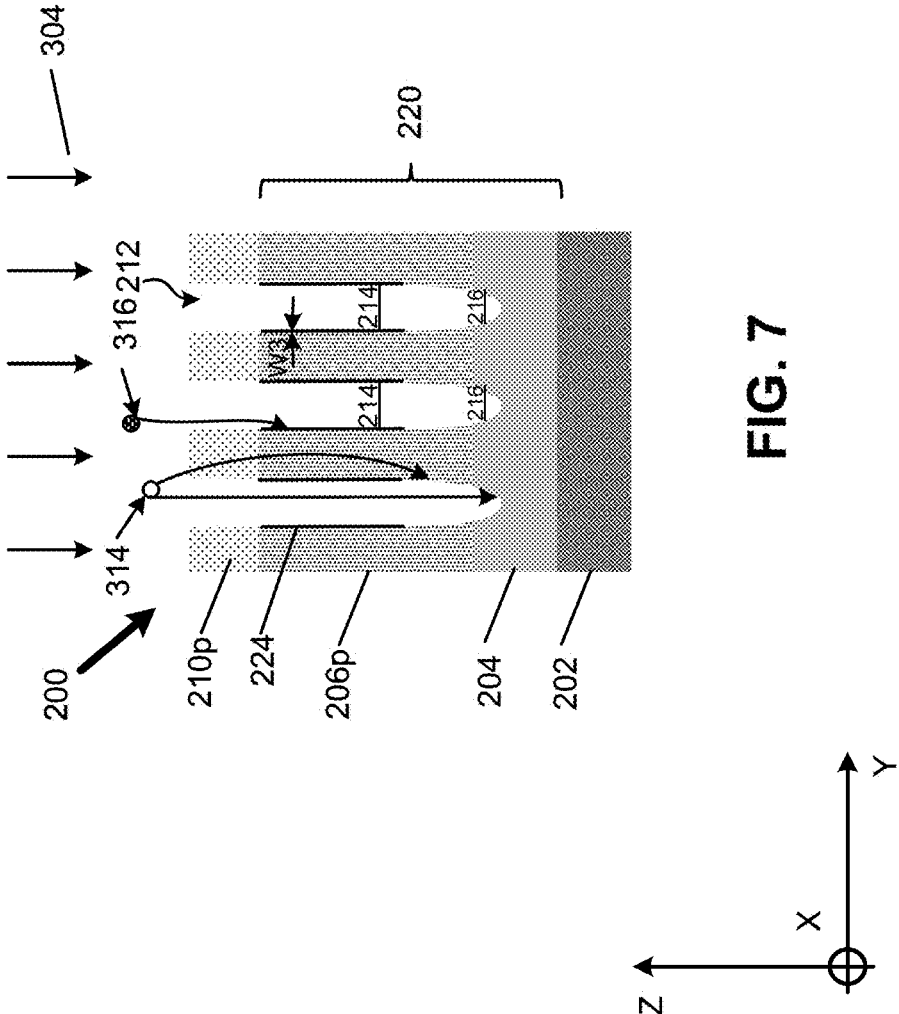
Figure 8:
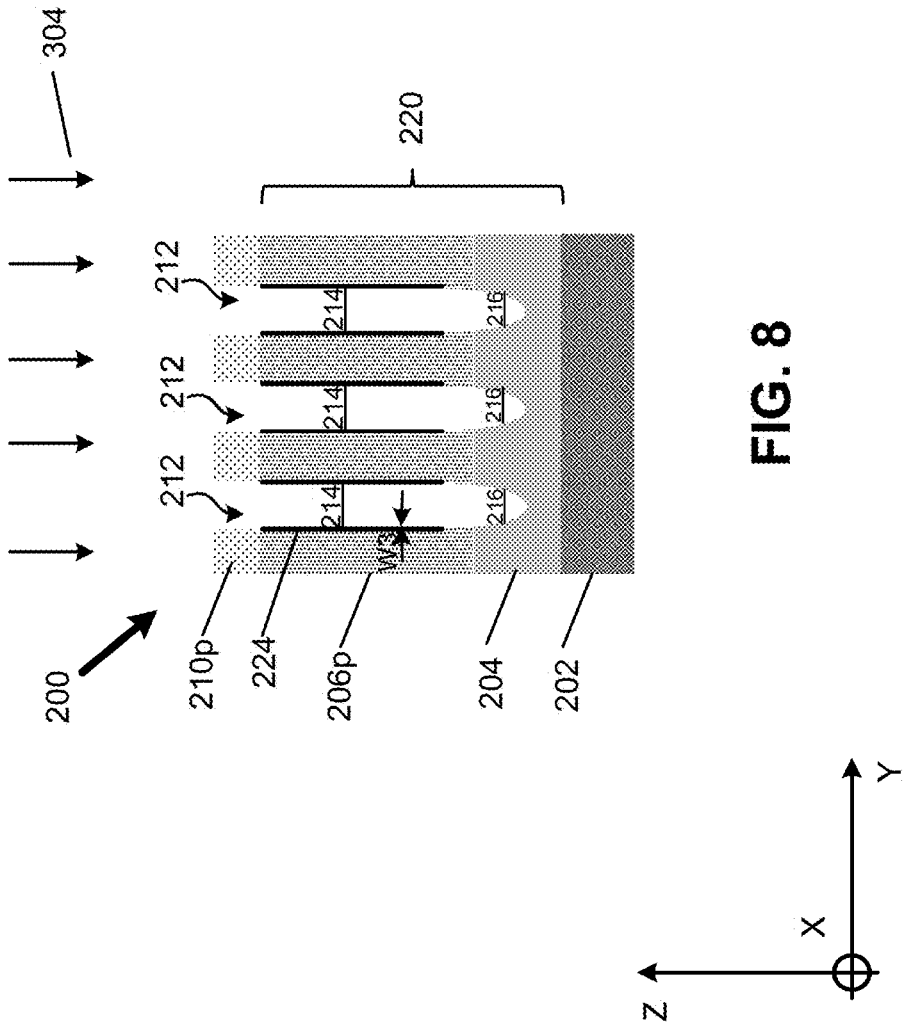
Figure 9:
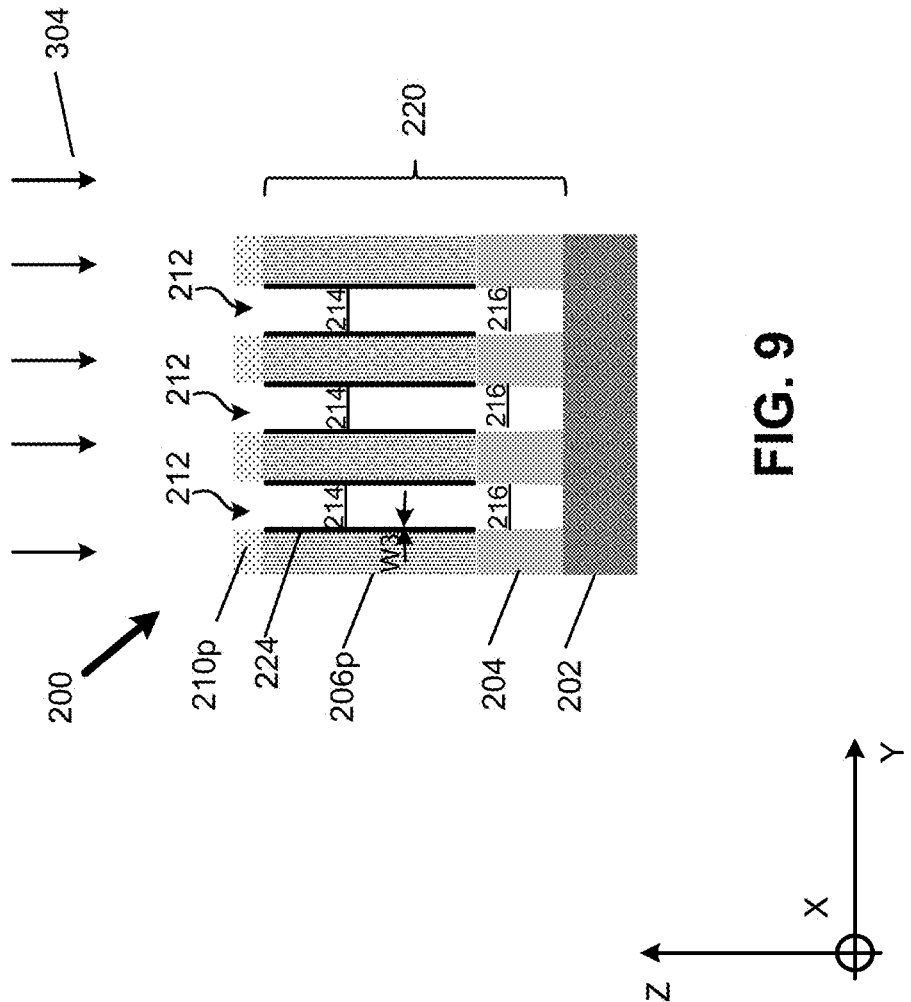
Figure 10:
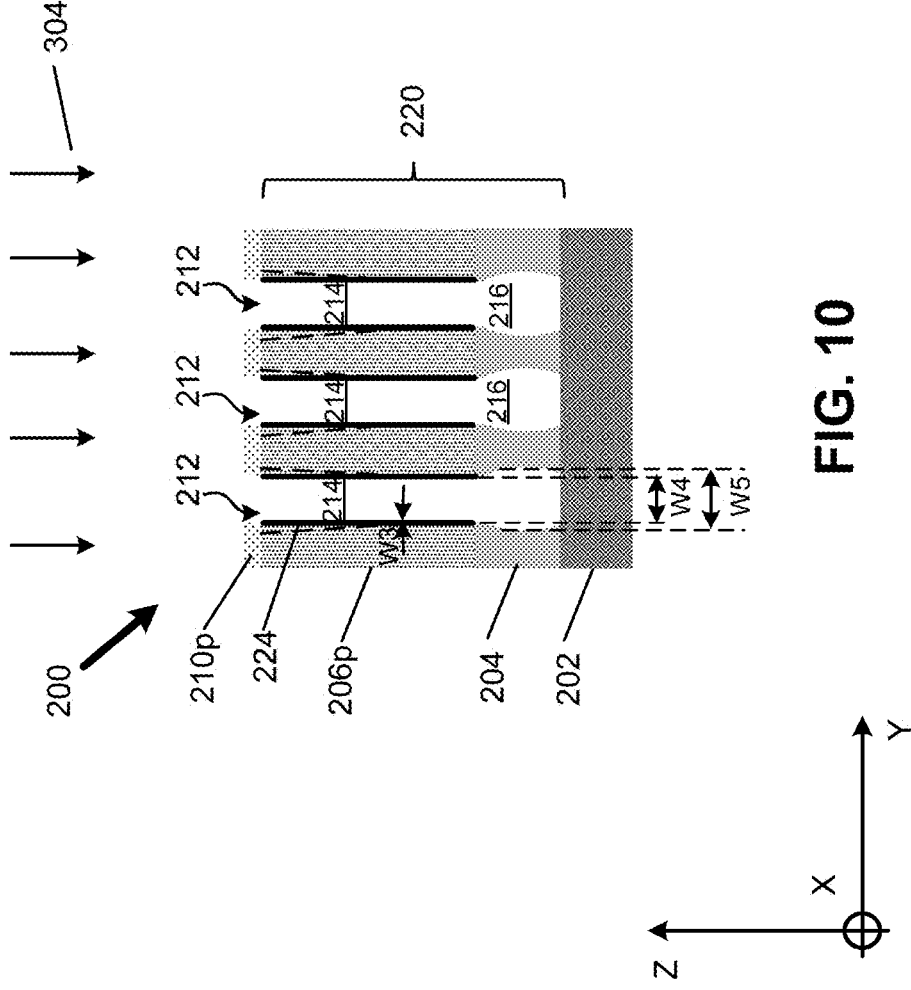

Referring to FIG. 7, the passivant 316 first forms the passivation layer 224 near the top opening of the first trenches 214. Referring to FIGS. 8-10, as the second etching process 304 is performed continuously, the second etchant 314 removes portions of the dielectric layer 204 to deepen the second trenches 216, and the passivant 316 simultaneously reacts with the metal layer 206 to grow the passivation layer 224. Comparing FIGS. 7, 8, 9, and 10, the passivation layer 224 gradually extends along the sidewalls of the top portions 206p towards the dielectric layer 204 and grows in thickness W3. As the passivation layer 224 includes one or more hydrocarbon materials (e.g., polymers), an etching selectivity between the metal layer 205, now covered with the passivation layer 224, and the dielectric layer 204 with respect to the second etchant 314 is improved. Accordingly, the removal of the top portions 206p (i.e., loss of the metal layer 206) by the second etchant 314 is retarded, reducing or preventing the formation of a concave profile (e.g., bowing or curving inward) along sidewalls of the top portions 206p, as indicated by the dashed line in FIG. 10. In some implementations, after completing the second etching process 304 to form the bottom portions 204p, the profile of the sidewalls of the top portions 206p are vertical, or substantially vertical, along the Z axis, while sidewalls of the bottom portions 204p have a concave profile with respect to the sidewalls of the top portions 206p, i.e., bows or curves inward from the sidewalls of the top portions 206p. In some implementations, retaining the sidewall profile of the top portions 206p to be substantially vertical helps improve electrical performance of the semiconductor structure 200. In some embodiments, such bowing causes the widest portion of each second trench 216 to have a width W5 that is greater than a width W4 of the bottom opening of the corresponding first trench 214.

Figure 11:
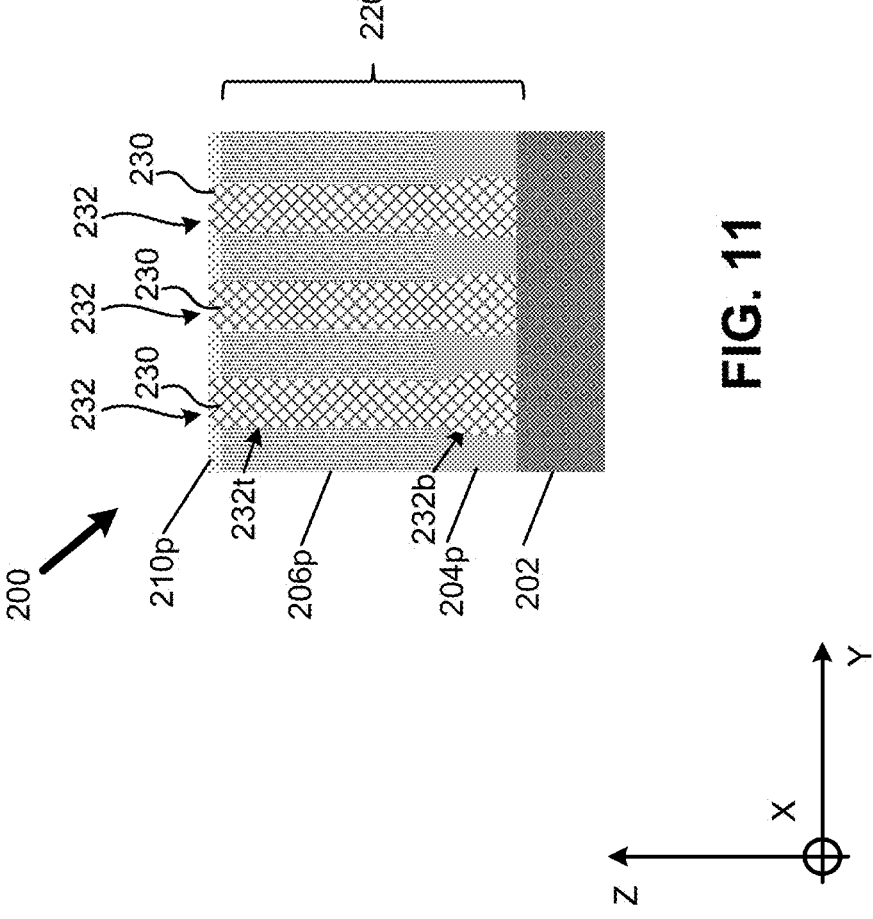

Referring to FIGS. 1 and 11, the method 100 at operation 114 performs additional operations to the semiconductor structure 200. For example, the method 100 at operation 114 may first perform a cleaning process to selectively remove the passivation layer 224 from the sidewalls of the top portions 206p without removing, or substantially removing, portions of the patterns 220. In some implementations, the passivation layer 224 is removed by an ashing process using a plasma containing $O_2$ or a plasma containing $N_2$ and/or $H_2$. Subsequently, still referring to FIG. 11, the method 100 forms a dielectric layer 230 over the semiconductor structure 200 to fill the trenches 212, resulting in a cut feature 232 between adjacent portions of the patterns 220. In this regard, each cut feature 232 extends vertically to directly contact the substrate 202. Furthermore, each cut feature 232 has a top portion 232t adjacent the top portion 206p with a substantially vertical sidewall profile and a bottom portion 232b adjacent the bottom portion 204p with a convex sidewall profile that bows or curves outward relative to the substantially vertical sidewall profile. Stated differently, the top portion 206p of the patterns 220 has a substantially vertical sidewall profile and the bottom portion 204p has a concave sidewall profile that bows or curves inward relative to the substantially vertical sidewall profile.

As discussed above, the metal layer 206 may be configured as a metal gate structure (or an active gate structure), or a portion thereof, that overlays a portion (e.g., a channel region) of an active region disposed in and/or over the substrate 202, and the dielectric layer 204 may be configured as isolation features (e.g., STI features) over the substrate 202 and surrounding a lower portion of the active region. In this regard, after performing the first etching process 302 and the second etching process 304, the metal gate structure and the isolation features are cut (or truncated) by the trenches 212, which are subsequently filled with the dielectric layer 230 to form the cut features 232 that separate the metal gate structure into segments.

Figure 12:
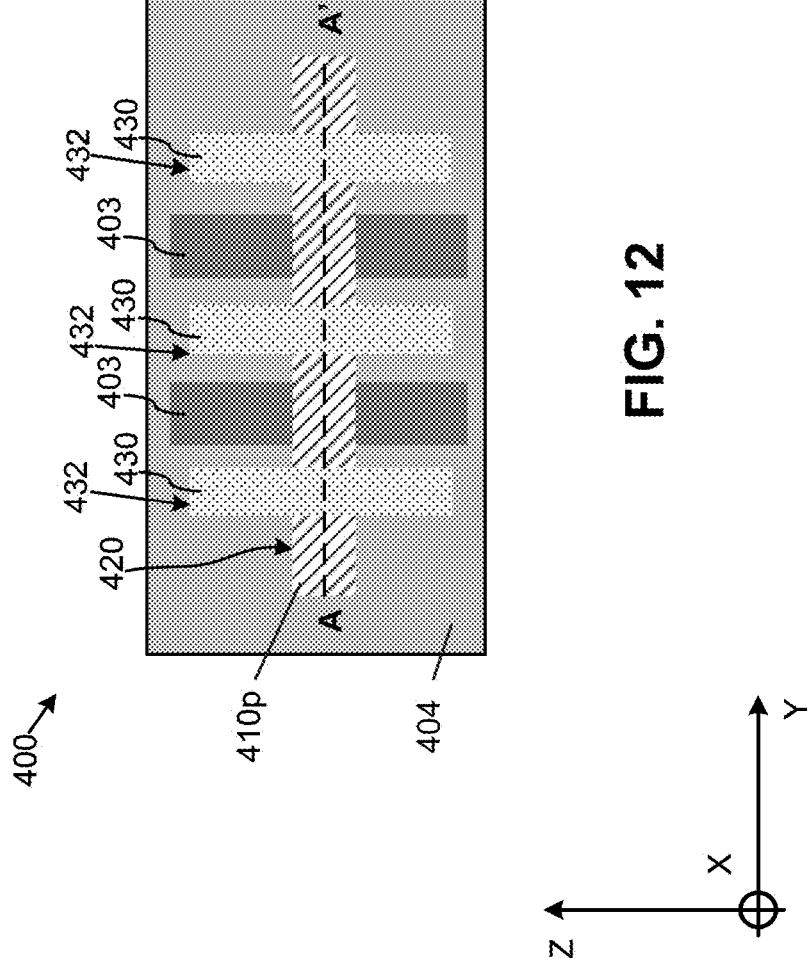
FIG. 12 illustrates a planar top view of an example semiconductor structure, in accordance with some implementations.

For example, FIG. 12 illustrates a planar top view of a semiconductor structure 400 similar to the semiconductor structure 200. As shown, the semiconductor structure 400 includes a plurality of active regions (e.g., fin-like active regions or fins) 403 protruding from a substrate 402 (see FIG. 13), which is similar to the substrate 202, along the Z axis. The active regions 403 may generally extend lengthwise along the X axis and be spaced from each other along the Y axis. In some implementations, the active region 403 includes a plurality of semiconductor layers (e.g., nanosheets) stacked vertically along the Z axis, with each semiconductor layer serving as a channel region of the active region 403. In the depicted implementations, the active regions 403 are isolated by isolation structures (e.g., STI features) 404 similar to the dielectric layer 204, where the isolation structures 404 are disposed over bottom sidewalls of the active regions 403 as depicted in FIG. 13.

Figure 13:
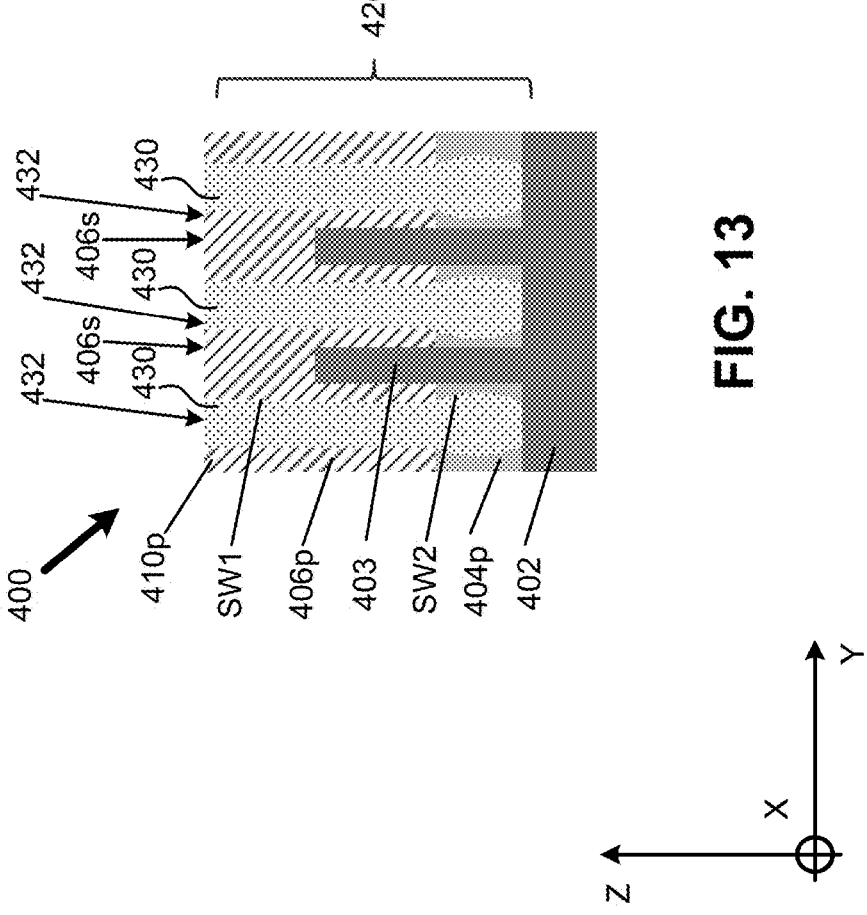
FIG. 13 illustrates a cross-sectional view of the semiconductor structure along line A-A' of FIG. 12, in accordance with some implementations.

Still referring to FIG. 12 and further to FIG. 13, which illustrates a cross-sectional view of the semiconductor structure 400 along line A-A' of FIG. 12, the semiconductor structure 400 includes patterns 420 similar to the patterns 220. The patterns 420 include top portions 406p over bottom portions 404p, where the top portions 406p and the bottom portions 404p are similar to the top portions 206p and bottom portions 204p, respectively. The patterns 420, which are overlaid by a patterned hard mask 410p similar to the patterned hard mask 210p, generally extend lengthwise along the Y axis and substantially perpendicular to the lengthwise direction of the active regions 403.

In the depicted embodiments, the patterns 420 include segments of metal gate structures (or active gate structures) separated by gate isolation features 432 along the Y axis, where the gate isolation features 432 include a dielectric layer 430 similar to the dielectric layer 230. The gate isolation features 432 generally extend lengthwise along the X axis and substantially parallel to the lengthwise direction of the active regions 403. In some implementations, a segment (alternatively referred to as a metal gate segment) 406s of the top portion 406p between adjacent gate isolation features 432 is disposed over a portion (e.g., a channel region) of the active region 403 to form a device, such as a FinFET or a nanosheet FET. In some implementations, the metal gate segment 406s includes a work function metal. The device further includes source/drain features (not depicted) disposed adjacent each metal gate segment 406s along the X axis (not depicted). In the depicted implementations, the patterns 420 and gate isolation cut features 432 are formed using some or all of the operations of the method 100 as applied to the formation of the patterns 220 and the cut features 232.

Referring to FIG. 13, which is analogous to portions of the semiconductor structure 200 depicted in FIG. 10, the gate isolation feature 432 is disposed adjacent the metal gate segment 406s and the bottom portion 404p (i.e., the isolation structures 404). The gate isolation feature 432 includes a sidewall having a top portion SW1 interfacing with the metal gate segment 406s and a bottom portion SW2 interfacing with the bottom portion 404p, where the bottom portion SW2 has a substantially concave profile with respect to the top portion SW1, which is substantially vertical.

As provided herein, the present disclosure relates to methods of etching metal and dielectric layers with increased etching selectivity between materials of different compositions, widened processing window, and improved processing throughput. For example, the present implementations provide an etching process (e.g., the second etching process 304) that utilizes an etchant (e.g., the second etchant 314) and a passivant (e.g., the passivant 316) in a reactive plasma to simultaneously etch a dielectric layer (e.g., the dielectric layer 204) and passivate a metal layer (e.g., the metal layer 206) overlaying the dielectric layer. As such, the passivation improves the etching selectivity between the metal layer and the dielectric layer, thereby reducing loss of the metal layer along its sidewalls during the etching of the dielectric layer. Furthermore, by protecting the metal layer during the etching of the dielectric layer, a processing window for forming high aspect-ratio features (e.g., the patterns 220) may be widened. Still further, by combining the etchant with the passivant in the reactive plasma, the etching process may be implemented in a one-step process rather than a series of iterative or cyclic passivation-and-etch processes, which improves the throughput of the fabrication process.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding.

Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A method, comprising:
providing a semiconductor substrate;
forming a dielectric layer over the semiconductor substrate;
forming a metal layer over the dielectric layer;
forming a patterned mask over the metal layer;
performing a first etching process using a first etchant to form top portions of patterns separated by trenches in the metal layer; and
performing a second etching process using a second etchant and a passivant to form bottom portions of the patterns in the dielectric layer separated by the trenches in the dielectric layer that extend from the trenches in the metal layer, the second etching process forming a hydrocarbon-containing passivation layer formed along sidewalls of the top portions of the patterns.

2. The method of claim 1, wherein forming the metal layer comprises depositing a conductive material comprising tungsten, hafnium, aluminum, titanium, tantalum, lanthanum, yttrium, molybdenum, copper, or combinations thereof.

3. The method of claim 1, wherein the metal layer comprises a work function metal.

4. The method of claim 1, wherein forming the dielectric layer comprises depositing a dielectric material having one or more of silicon nitride, silicon oxide, a low-k dielectric material, or combinations thereof.

5. The method of claim 1, wherein the first etchant and the second etchant each comprise a fluorine-containing gas, a chlorine-containing gas, or a combination thereof.

6. The method of claim 1, wherein the passivant differs from the first etchant and the second etchant in composition, the passivant having one or more of the following:
$CH_4$,
$CH_xF_y$, x being greater than 0 and y being greater than or equal to 0, and
a combination of a carbon-containing gas and a hydrogen-containing gas, such that the hydrocarbon-containing passivation layer is formed to include a hydrocarbon material.

7. The method of claim 1, wherein performing one or both of the first etching process and the second etching process uses a carrier gas, a diluent gas, or both.

8. The method of claim 1, wherein performing the second etching process simultaneously extends the trenches in the dielectric layer and grows a thickness of the hydrocarbon-containing passivation layer.

9. A method, comprising:
providing a semiconductor substrate;
forming a dielectric layer over the semiconductor substrate;
forming a conductive layer over the dielectric layer to form a stack; and
forming a plurality of patterns in the stack, including:
performing a first etching process to form top portions of the patterns in the conductive layer separated by first trenches; and
performing a second etching process to form bottom portions of the patterns in the dielectric layer separated by second trenches that extend from the first trenches, the second etching process forming a hydrocarbon-containing passivation layer along sidewalls of the top portions of the patterns.

10. The method of claim 9, wherein forming the patterns further comprises forming a patterned mask over the stack before performing the first etching process.

11. The method of claim 9, wherein performing the second etching process results in sidewalls of the bottom portions of the patterns to have a concave profile relative to the sidewalls of the top portions of the patterns.

12. The method of claim 9, wherein a width of a widest portion of the second trenches is greater than a width of a bottom opening of the first trenches.

13. The method of claim 9, wherein performing the second etching process comprises applying a passivant having one or more of the following:
$CH_4$,
$CH_xF_y$, x being greater than 0 and y being greater than or equal to 0, and
a combination of a carbon-containing gas and a hydrogen-containing gas.

14. The method of claim 13, wherein performing the second etching process comprises applying an etchant that includes a fluorine-containing gas selected from $CF_4$, $SF_6$, $NF_3$, and $CH_xF_y$, x being greater than or equal to 0 and y being greater than 0.

15. The method of claim 14, wherein the conductive layer has a composition that is non-selective to the etchant applied during the second etching process.

16. The method of claim 9, further comprising forming an active region over the semiconductor substrate, wherein forming the dielectric layer comprises forming shallow-trench isolation features to surround the active region, wherein forming the conductive layer comprises forming a metal gate structure over a portion of the active region, and wherein the first trenches and the second trenches separate the metal gate structure into segments.

17. The method of claim 9, wherein the dielectric layer is a first dielectric layer, the method further comprising forming a second dielectric layer to fill the first trenches and the second trenches.

\* \* \* \* \*